United States Patent [19]
Gotou

[11] Patent Number: 5,308,999
[45] Date of Patent: May 3, 1994

[54] MOS FET HAVING A THIN FILM SOI STRUCTURE

[75] Inventor: Hiroshi Gotou, Zama, Japan

[73] Assignee: Fujitsu Limited, Kawasaki, Japan

[21] Appl. No.: 21,857

[22] Filed: Feb. 24, 1993

[30] Foreign Application Priority Data

Feb. 27, 1992 [JP] Japan .................................. 4-41039

[51] Int. Cl.⁵ ...................... H01L 29/04; H01L 29/76
[52] U.S. Cl. ........................................ 257/66; 257/62; 257/213; 257/57
[58] Field of Search ............... 257/347, 348, 349, 354, 257/66, 69, 57, 213; 148/150, 164; 437/43, 62, 78, 90

[56] References Cited
U.S. PATENT DOCUMENTS 4,996,574 2/1991 Shirasaki ............................ 357/23.7
5,120,666 6/1992 Gotou .................................... 437/40

Primary Examiner—William L. Sikes
Assistant Examiner—Fetsum Abraham
Attorney, Agent, or Firm—Nikaido, Marmelstein, Murray & Oram

[57] ABSTRACT

The breakdown voltage of an MIS field effect transistor having an SOI structure is improved by forming a gate electrode on the top surface and two side surfaces of a channel region of the SOI layer and by partially extending the gate electrode toward the inside under the bottom of the channel region such the gate electrode is not completly connected.

6 Claims, 9 Drawing Sheets

Y-Y'

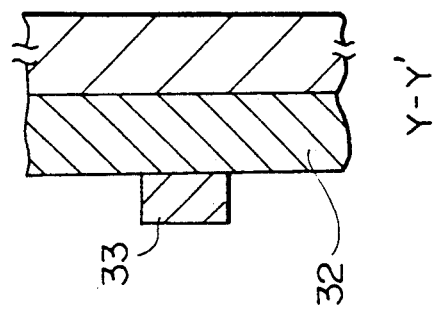
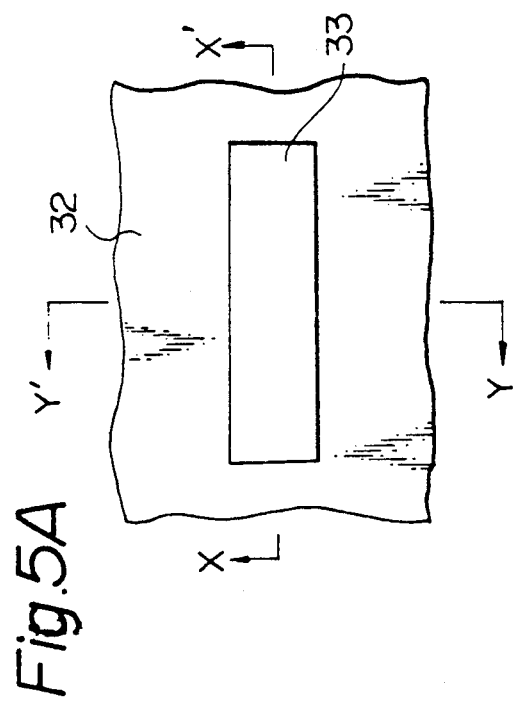
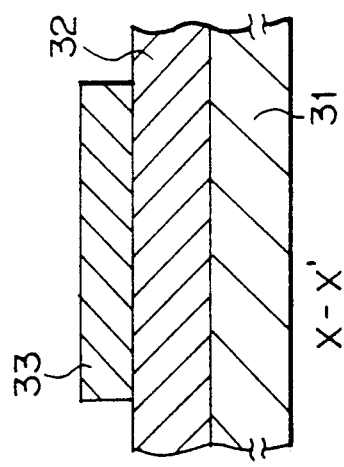

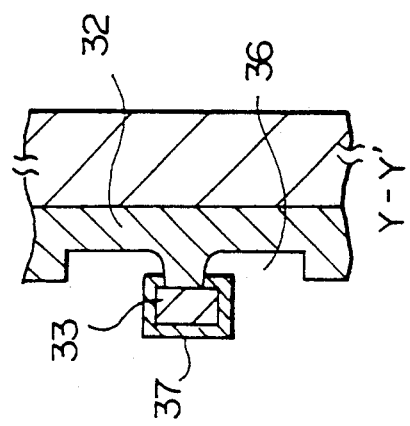
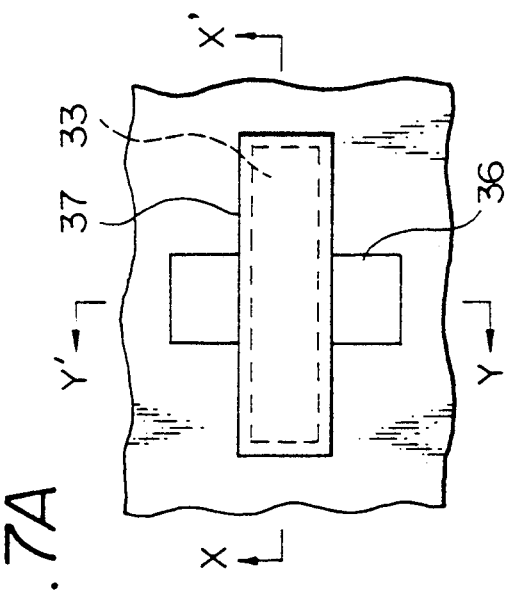
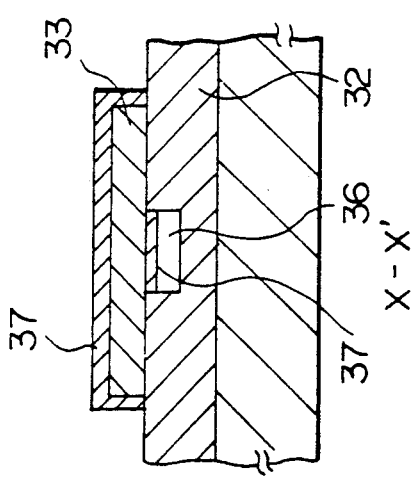

MOS FET HAVING A THIN FILM SOI STRUCTURE

BACKGROUND OF THE INVENTION

1. Field of the Invention

The present invention relates to a semiconductor device, more specifically a MIS (Metal Insulator Semiconductor) field effect transistor having a thin film SOI (Silicon On Insulator / Semiconductor On Insulator) structure.

2. Description of the Related Art

Recent improved performances of semiconductor devices largely depend on improved performances of unit transistors and reduction of their size. One of the high performance transistors that has attracted attention is a MIS field effect transistor having a thin film SOI structure.

One of the typical MIS field effect transistors having a thin film SOI structure is the mesa type transistor, in which an island of a silicon or semiconductor layer formed on an insulating layer, such as an $SiO_2$ layer, comprises a channel region of one conductivity type at the center of the island and source and drain regions of opposite conductivity type adjacent to and sandwiching the channel region. A gate electrode is formed on and covers the top and two side surfaces of the channel region. The source and drain regions are connected to contacts or source and drain electrodes.

In this type of MIS field effect transistor having a thin film SOI structure, the breakdown voltage between the source and drain is low, at highest 4.5 V, because a parasitic bipolar transistor involved in this structure is activated at a low voltage.

An all round type MIS field effect transistor having a thin film SOI structure is also known. In this type, a gate electrode covers not only the top and two side surfaces but also the bottom surface of the channel region, that is, all around the channel region of the island of silicon or a semiconductor. Of cource, the gate electrode does not exist on the interfaces between the channel region and the source and drain regions.

This all around type MOS field effect transistor having a thin film SOI structure also has a low breakdown voltage between the source and drain, at highest 4.5 V, as a result of the concentration of an electric field in the drain region.

Thus, the object of the present invention is to provide MIS field effect transistors having a thin film SOI structure which may have an improved breakdown voltage between the source and drain.

SUMMARY OF THE INVENTION

The above object of the present invention is attained by forming a gate electrode on the top and two side surfaces of a channel region of the SOI layer and by partially extending the gate electrode toward the inside under the bottom of the channel region such that the gate electrode under the channel region is not completely connected.

Thus, in accordance with the present invention, there is provided a MIS field effect transistor having an SOI structure, which comprises an insulating layer; an island of a semiconductor layer formed on the insulating layer, the island of the semiconductor layer having a channel region of one conductivity type at a center of the island and source and drain regions of the opposite conductivity type adjacent to and sandwiching the channel region, the channel region having a top surface, first and second side surfaces and bottom surface not contacing to the source and drain regions; and a gate electrode formed on the top surface, the first and second side surfaces and the bottom surface of channel region, the gate electrode under the bottom surface extending from the first and second side surfaces toward inside of the bottom surface of the channel region by predetermined distances but not contacting with each other.

In another embodiment of the present invention, there is also provided a MIS field effect transistor having a thin film SOI structure, which comprises an insulating layer; an island of a semiconductor layer formed on the insulating layer, the island of the semiconductor layer having a channel region of one conductivity type at a center of the island and source and drain regions of the opposite conductivity type adjacent to and sandwiching the channel region, the channel region having a channel length between the source and drain regions, the channel region having a top surface, first and second side surfaces and bottom surface not contacing the source and drain regions; and a gate electrode formed on the top surface, the first and second side surfaces and the bottom surface of channel region, the gate electrode under the bottom surface extending from the first and second side surfaces toward inside of the bottom surface of the channel region by predetermined distances and contacting with each other only in a part of the gate length.

BRIEF DESCRIPTION OF DRAWINGS

FIGS. 5A to 9C show the main steps of fabricating a MIS field effect transistor having a thin film SOI structure in accordance with the first embodiment of the present invention.

DESCRIPTION OF THE PREFERRED EMBODIMENTS

Before describing the present invention, the prior art MIS field effect transistors having a thin film SOI structure are illustrated so as to facilitate an understanding of the present invention.

Figure 1:
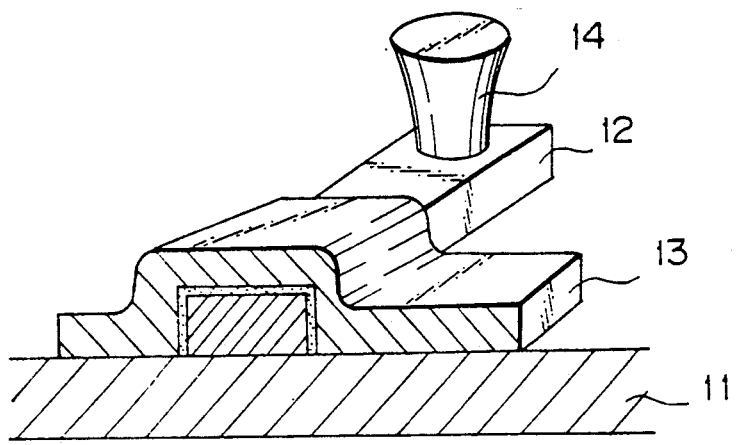
FIG. 1 shows a mesa type MOS field effect transistor having a thin film SOI structure of the prior art.

FIG. 1 shows a mesa type MIS field effect transistor having a thin film SOI structure. In FIG. 1, 11 denotes an insulating layer of $SiO_2$, 12 an island of an SOI layer, i.e., silicon on the $SiO_2$ (insulator), 13 a gate electrode, and 14 a contact. In the island of the SOI layer, a channel region of one conductivity type is formed at the center thereof, and source and drain regions of the opposite conductivity type are formed on both sides of the channel region. The gate electrode 13 covers the top and both side surfaces of the channel region or the SOI layer. Contacts or source and drain electrodes 14 are formed near the ends of the source and drain regions.

Figure 2:
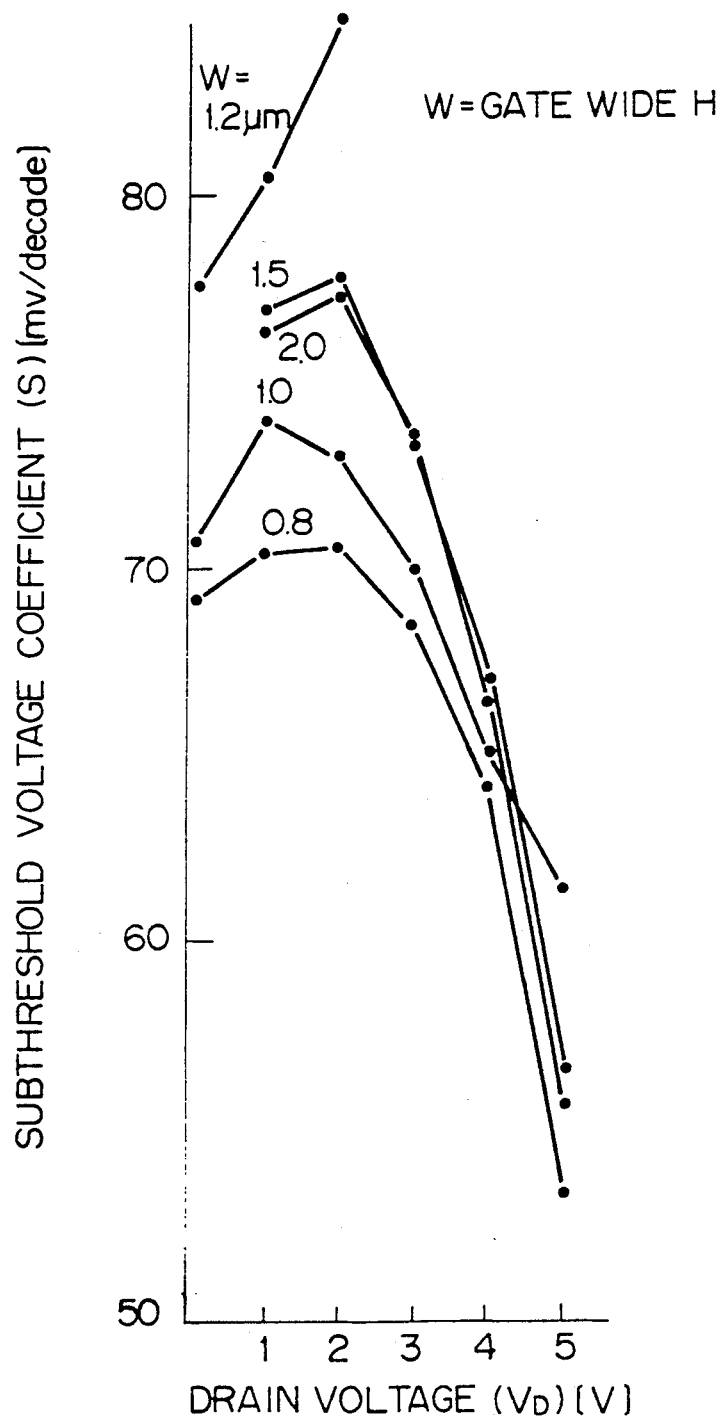
FIG. 2 shows relationships between the subthreshold voltage coefficient (S) and the drain voltage ($V_D$) of the mesa type MOS field effect transistors of the prior art.

FIG. 2 shows relationships between the subthreshold voltage coefficient (S) and the drain voltage ($V_D$) when the gate width of mesa type MIS field effect transistors having a thin film SOI structure varies. These MIS field effect transistors have an island SOI layer thickness (t) of 0.3 $\mu$m, a gate length (L) of 2.0 $\mu$m, and a gate width (W) of from 0.8 to 1.2 $\mu$m. As seen in FIG. 2, the subthreshold voltage coefficient (S) drops significant from around 2.0 V and the breakdown voltage bewteen the source and drain is at most 4.5 V.

Figure 3:
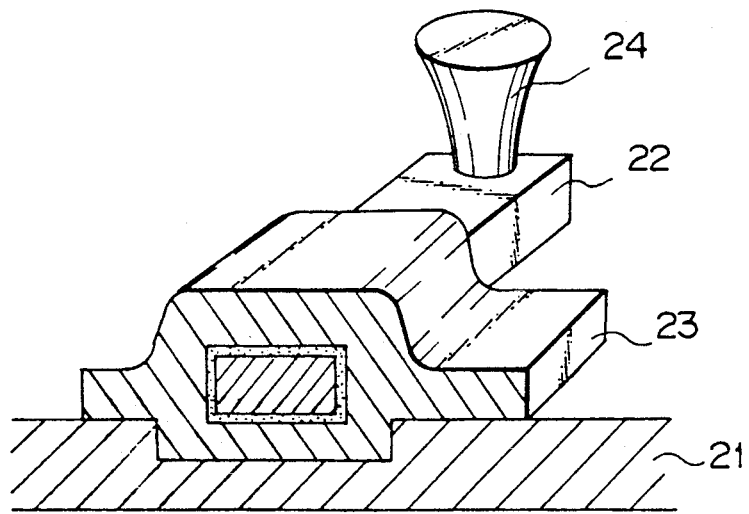
FIG. 3 shows an all around type MIS field effect transistor having a thin film SOI structure of the prior art.

FIG. 3 shows an all around type MIS field effect transistor having a thin film SOI structure. In FIG. 3, 21 denotes an insulating layer of $SiO_2$, 22 an island of SOI layer, i.e., a silicon on the $SiO_2$ (insulator), 23 a gate electrode, and 24 a contact. In the island of an SOI layer, a channel region of one conductivity type is formed at the center thereof, and source and drain regions of the opposite conductivity type are formed on both sides of the channel region. The gate electrode 23 covers all around (i.e., the top, both sides and bottom surfaces of) the channel region or the SOI layer. Contacts or source and drain electrodes 14 are formed near the ends of the source and drain regions. (see for example J. P. Colinge et al, IEDM 90, p595, 1990; and U.S. Pat. No. 5,120,666).

Figure 4:
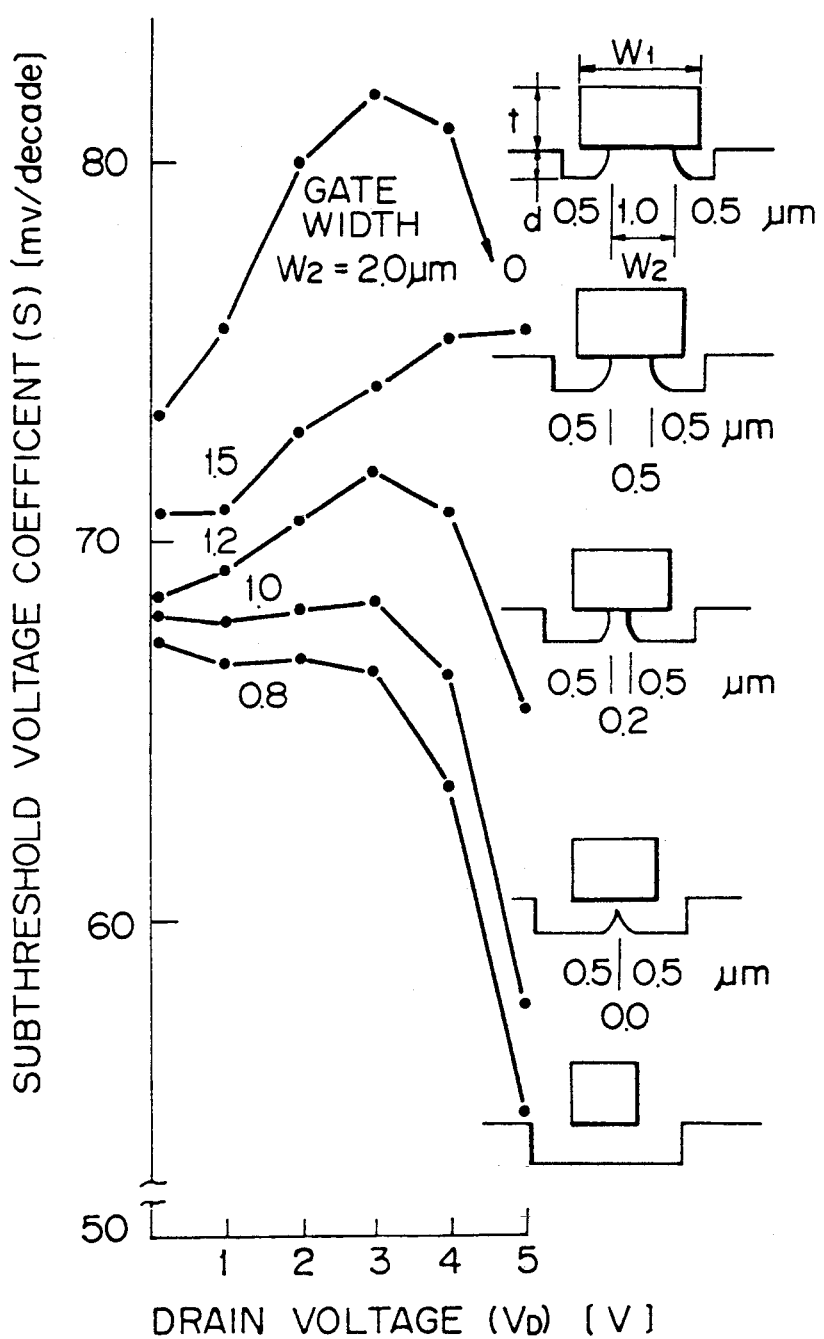
FIG. 4 shows relationships between the subthreshold voltage coefficient (S) and the drain voltage ($V_D$) of a MOS field effect transistor having a thin film SOI structure in which the gate extends to or covers only a portion of the bottom of the island SOI layer.

Relationships between the subthreshold voltage coefficient (S) and the drain voltage ($V_D$) of an all around type MIS field effect transistor having a thin film SOI structure are shown at the lowest position in FIG. 4 (indicated as a gate width of 0.8 $\mu$m). It is seen that the breakdown voltage between the source and drain of the all around type MIS field effect transistor having a thin film SOI structure is at most 4.5 V.

In contrast, the breakdown voltage between source and drain of a MIS field effect transistor having a thin film SOI structure can be improved in accordance with the present invention.

FIG. 4 also shows relationships between the subthreshold voltage coefficient (S) and the drain voltage ($V_D$) of MIS field effect transistors having a thin film SOI structure, in which the gate extends to or covers only a portion of the bottom of the island SOI layer.

In FIG. 4, the MIS field effect transistors have structures as shown in the right portions of FIG. 4 and have an island SOI layer thickness (t) of 0.3 $\mu$m, a gate length (L) of 2.0 $\mu$m, a width ($W_1$) of a gate or island SOI layer from 2.0 $\mu$m to 0.8 $\mu$m, a depth (d) of the etched portion under the island SOI layer of 0.48 $\mu$m, a width of the each etched portion under the island SOI layer of 0.5 $\mu$m, and a gap width ($W_2$) between the two etched portions or the extended portions of the gate under the island SOI layer from 0 to 1.0 $\mu$m. When the width ($W_1$) of the gate is 2.0 $\mu$m, the gate covers the bottom of the channel region by 0.5 $\mu$m on each side and leaves a gap formed by the insulating layer therebetween of 1.0 $\mu$m. As the width ($W_1$) of the gate decreases from 2.0 $\mu$m to 1.5 $\mu$m to 1.2 $\mu$m to 1.0 $\mu$m to 0.8 $\mu$m, the width of the insulating layer gap decreased from 1.0 $\mu$m to 0.5 $\mu$m to 0.2 $\mu$m to 0 $\mu$m (partially connected) to 0 $\mu$m (completely connected) since the width of the each etched portion under the SOI layer is fixed at 0.5 $\mu$m.

It is seen from FIG. 4 that the breakdown voltage between the source and drain of a MIS field effect transistor having a thin film SOI structure can be improved to 6.0 V to 7.0 V (1) by forming the gate on the top and two side surfaces of the channel region and under portions of the bottom of the channel region from the two sides thereof, such that the portions of the gate under the channel region do not contact with each other, or (2) by forming the gate on the top and two side surfaces of the channel region and under portions of the bottom of the channel region from two sides thereof, such that the portions of the gate under the channel region partially contact with each other. This improvement in breakdown voltage between the source and drain, in accordance with the present invention over the prior art has been formed to be more than 30%.

The insulating layer gap between portions of the gate under the channel region is preferably 0.1 to 0.5 $\mu$m. In the case of the above (2), i.e., if portions of the gate under the channel region partially contact with each other, the insulating layer gap of the portions where said portions do not contact with each other is preferably 0.1 to 0.5 $\mu$m wide. This range of the insulating layer gap has been found to prevent the concentration of the electric field in the drain region, as well as parasitic bipolar operation.

Fabrication of a mesa type MIS field effect transistor having a thin film SOI structure of a first embodiment of the present invention is described with reference to the drawings.

Referring to FIG. 5A to 5C, in which FIG. 5B is a section cut along the line X - X' in FIG. 5A and FIG. 5C is a section cut along the line Y - Y' in FIG. 5A, an SOI substrate is prepared in which an SOI layer 0.5 $\mu$m thick is formed on a silicon substrate 31 with an $SiO_2$ layer 32 therebetween. The SOI layer is patterned into an island 33. The island SOI layer 33 is dry oxidized to cover the surface of the island SOI layer 33 with a 30 nm thick oxide film. Further, a silicon nitride layer is formed over the entire surface of the substrate by CVD.

Figure 6C:
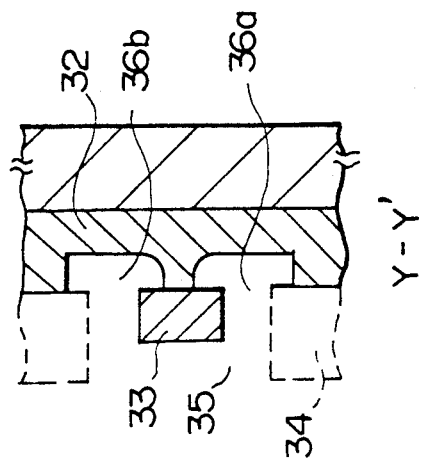
Figure 6A:
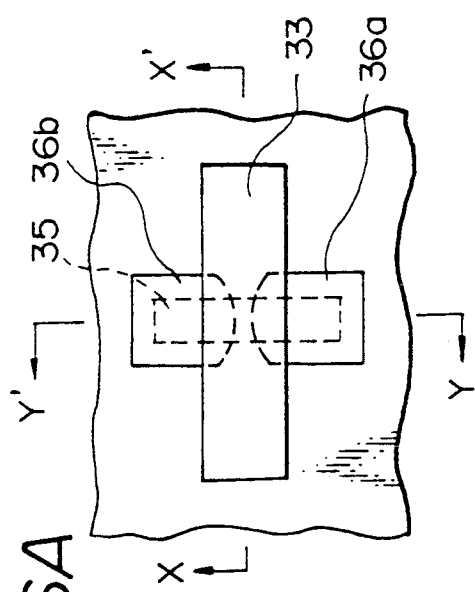
Figure 6B:
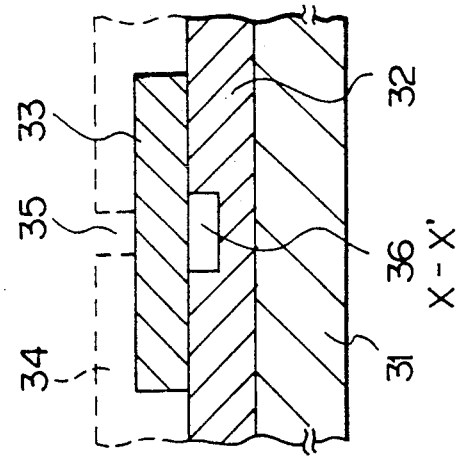

Referring to FIGS. 6A to 6C, in which FIG. 6B is a section cut along the line X - X' in FIG. 6A and FIG. 6C is a section cut along the line Y - Y' in FIG. 6A, a resist 34 is completely coated and patterned to open an etching window 35 over both sides of a region for forming a channel. With the patterned resist 34, the silicon nitride film is etched to remove the same in the form of the etching window 35. The resist 34 is then removed.

With the silicon nitride film having the etching windows 35 as a resist, the $SiO_2$ layer 32 is wet etched. This etching etches not only the $SiO_2$ layer 32 under the etching window 35 but also etches the inside portions of the $SiO_2$ layer 32 under the island SOI layer 33. However, this side etching is stopped before a tunnel is formed so that a wall having a thickness of 0.1 to 0.5 $\mu$m remains. Thus, separate grooves 36a and 36b are formed.

Referring to FIGS. 7A to 7C, in which FIG. 7B is a section cut along the line X - X' in FIG. 7A and FIG. 7C is a section cut along the line Y - Y' in FIG. 7A, dry oxidizing is performed to form an oxide film 50 nm thick. After a thin oxide film formed on the silicon nitride film is removed, the silicon nitride film is removed by wet etching with a phosphoric acid-containing solution or by dry etching.

After a sacrificial oxidation in which an oxide layer 100 nm thick is formed and then removed, or immediately, dry oxidation is performed to form a gate oxide film 37 of $SiO_2$ having a thickness of 30 nm on the exposed surface of the SOI layer 33.

Figure 8C:
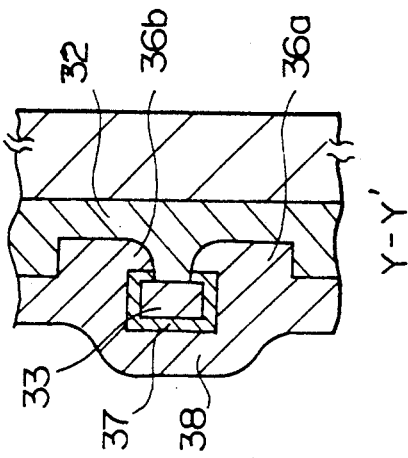
Figure 8A:
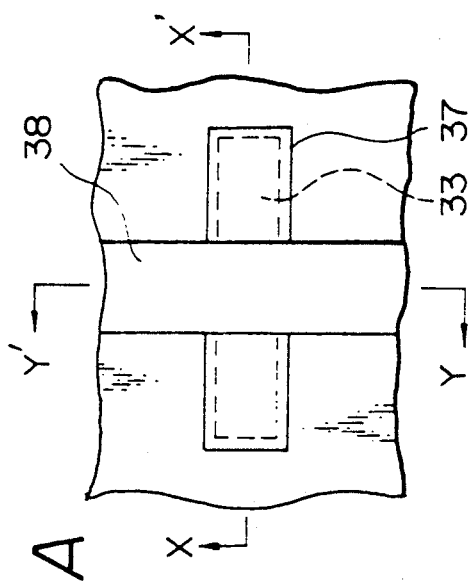
Figure 8B:
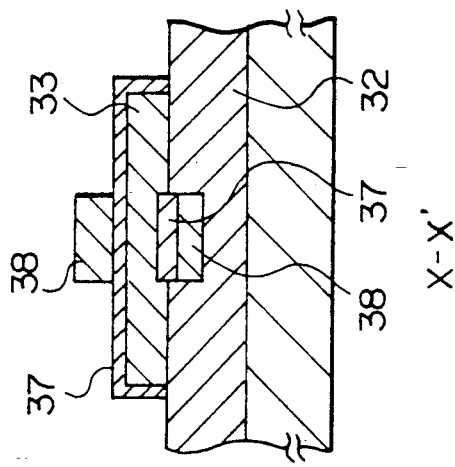

Referring to FIGS. 8A to 8C, in which FIG. 8B is a section cut along the line X - X' in FIG. 8A and FIG. 8C is a section cut along the line Y - Y' in FIG. 8A, a doped polysilicon layer, 0.5 μm thick, is deposited by CVD and patterned to form a gate electrode 38. The gate electrode 38 not only covers the top and side surfaces of the channel region but also fills the grooves 36a and 36b, i.e., portions under the SOI layer 33. The gate electrode 38 however does not extend over the entire bottom of the channel region as a result of the SiO₂ layer wall.

Figure 9C:
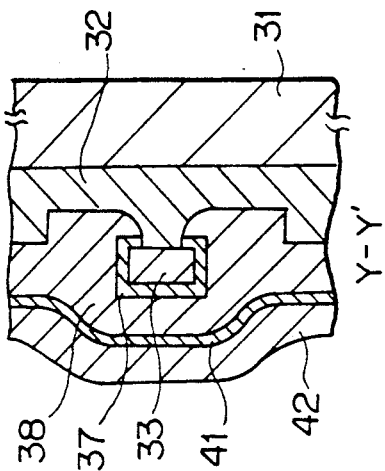
Figure 9A:
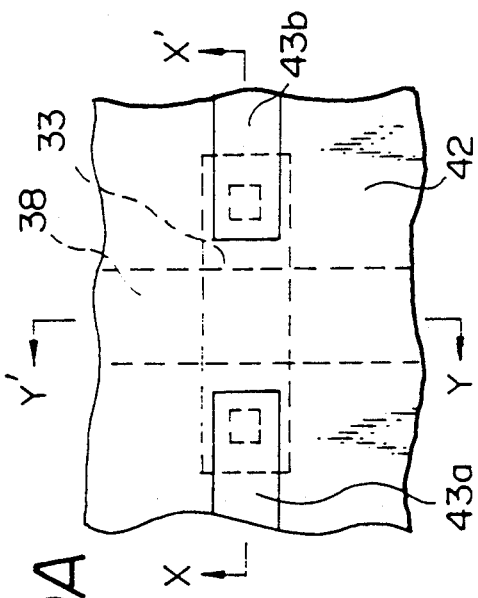
Figure 9B:
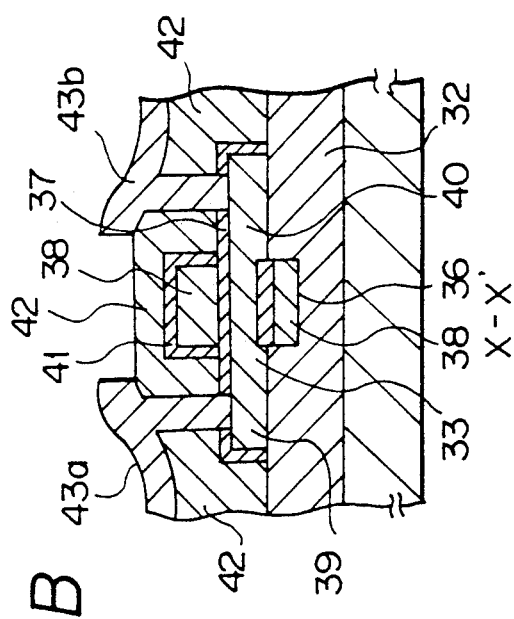

Referring to FIGS. 9A to 9C in which FIG. 9B is a section cut along the line X - X' in FIG. 9A and FIG. 9C is a section cut along the line Y - Y' in FIG. 9A, arsenic ions are implanted into the SOI layer 33 with the gate electrode 38 as a mask to form a source region 39 and a drain region 40. The exposed surface of the gate electrode 38 is oxidized to form an SiO₂ film 41, 50 nm thick. A PSG layer 42 is deposited so as to form an interlayer insulating layer over the entire area. After forming contact windows, a metal layer is deposited and patterned to form metal wiring layers 43a and 43b.

Thus, a MIS field effect transistor having an SOI structure in accordance with the first embodiment of the present invention is obtained.

Figure 10:
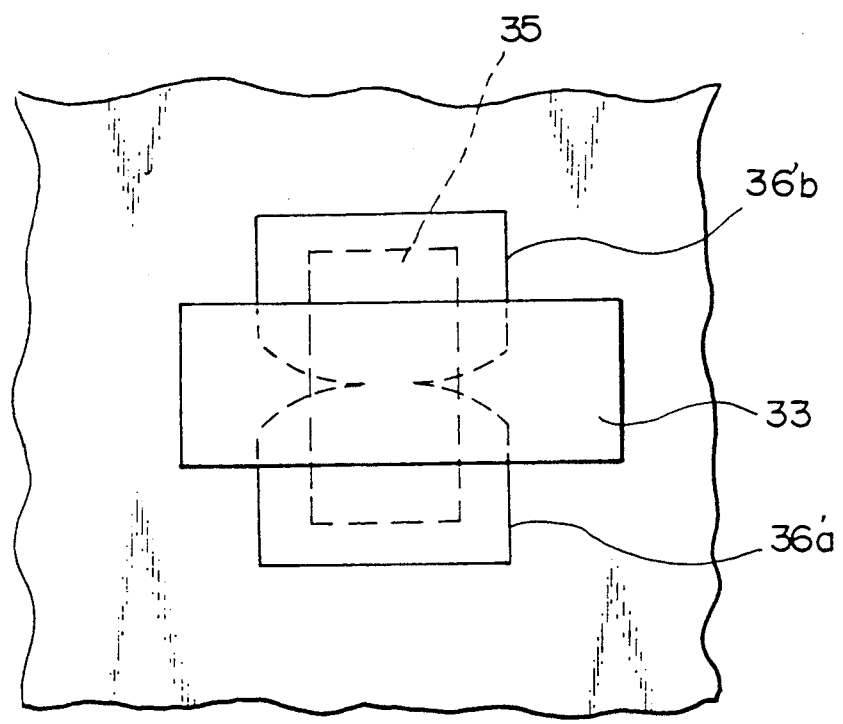
FIG. 10 shows a main step of fabricating a MIS field effect transistor having a thin film SOI structure in accordance with the second embodiment of the present invention.

FIG. 10 shows a typical gate pattern under the channel region of a MIS field effect transistor having an SOI structure in accordance with the second embodiment of the present invention. The process of fabricating this MIS field effect transistor is the same as that described above with referrence to FIGS. 5A to 9C, except that the wet etching of the SiO₂ layer 32 to form the grooves 36a and 36b is modified. FIG. 10 corresponds to FIG. 6A. The above modified etching is stopped when the grooves 36'a and 36'b are made so as to partially connect with each other or partially form a tunnel, as shown in FIG. 10. The insulating layer gap between the grooves 36'a and 36'b at a location where they are not connected to each other or a maximum gap is preferably made to be 0.1 to 0.5 μm.

It should be noted that in the conventional process of fabricating a MIS field effect transistor having an SOI structure, when the SOI layer is etched to form an island SOI layer, the SiO₂ layer underlying the SOI layer is often slightly etched along the periphery of the island SOI layer and even toward the inside and, accordingly, when a metal for forming a gate electrode is then deposited, the metal may be filled in the above slightly etched portion or groove of the SiO₂ along the periphery and inside of the island SOI layer. This is different from the present invention in that the groove of this conventional process is formed entirely along the periphery of the island SOI layer, not selectively in the gate length beside the channel region, as in the present invention.

I claim:

1. A MIS field effect transistor having an SOI structure, comprising:
   an insulating layer;
   an island of a semiconductor layer formed on the insulating layer, the island of the semiconductor layer having a channel region of one conductivity type at a center of the island and source and drain regions of the opposite conductivity type adjacent to and sandwiching the channel region, the channel region having a top surface, first and second side surfaces and bottom surface; and
   a gate electrode formed on the top surface, the first and second side surfaces and the bottom surface of the channel region, the gate electrode having first and second portions under the bottom surface extending from the first and second side surfaces toward inside of the bottom surface of the channel region by predetermined distances but not contacting with each other.

2. A MIS field effect transistor according to claim 1, wherein the gate electrode has a gap defined between the first and second portions under the bottom surface of the channel region of 0.1 to 0.5 μm.

3. A MIS field effect transistor having an SOI structure, comprising:
   an insulating layer;
   an island of a semiconductor layer formed on the insulating layer, the island of the semiconductor layer having a channel region of one conductivity type at a center of the island and source and drain regions of the opposite conductivity type adjacent to and sandwiching the channel region, the channel region having a channel length between the source and drain regions, the channel region having a top surface, first and second side surfaces and bottom surface; and
   a gate electrode formed on the top surface, the first and second side surfaces and the bottom surface of the channel region, the gate electrode having first and second portions under the bottom surface extending from the first and second side surfaces toward inside of the bottom surface of the channel region by predetermined distances and contacting with each other only in a part of the channel length.

4. A MIS field effect transistor according to claim 3, wherein the gate electrode has a gap defined between the first and second portions under the bottom of the channel region of 0.1 to 0.5 μm, maximum.

5. A MIS field effect transistor having an SOI structure, comprising:
   an insulating layer;
   a semiconductor island formed on said insulating layer, said island having a channel region of one conductivity type and source and drain regions of an opposite conductivity type adjacent to and sandwiching the channel region, the channel region having a top surface, first and second side surfaces and a bottom surface, said insulating layer having formed a wall portion extending to and contacting a gap portion of the bottom surface of the channel region; and
   a gate electrode formed on the top surface, first and second side surfaces and bottom surface of the channel region, wherein said gate electrode is formed to extend from the first and second side surfaces to first and second portions of the bottom surface separated by the gap portion with the wall portion of said insulating layer, and the gap portion having a predetermined width for separating the first and second portions having said gate electrode from each other.

6. A MIS field effect transistor according to claim 1, wherein the gap portion of the bottom surface with the wall portion of said insulating layer has a width of 0.1 to 0.5 μm.

* * * * *